US007685897B1

(12) United States Patent
Hung

(10) Patent No.: US 7,685,897 B1
(45) Date of Patent: Mar. 30, 2010

(54) DIFFERENTIAL GEAR TRANSMISSION TYPE WORK UNITS POSITIONING SYSTEM

(75) Inventor: Ying-Ming Hung, Taipei Hsien (TW)

(73) Assignee: Utechzone Co., Ltd., Taipei Hsien (TW)

( * ) Notice: Subject to any disclaimer, the term of this patent is extended or adjusted under 35 U.S.C. 154(b) by 1049 days.

(21) Appl. No.: 10/968,074

(22) Filed: Oct. 20, 2004

(51) Int. Cl.
*F16H 27/02* (2006.01)
*F16H 1/04* (2006.01)

(52) U.S. Cl. ........................................ 74/89.17; 74/422

(58) Field of Classification Search ................ 74/89.17, 74/422, 89.11, 89.16, 89.2, 109, 424.6
See application file for complete search history.

(56) References Cited

U.S. PATENT DOCUMENTS 3,347,111 A * 10/1967 Rouillard et al. ........... 74/501.6
5,437,485 A * 8/1995 Goldschmidt ............... 292/142
5,517,872 A * 5/1996 Anada ....................... 74/89.21

* cited by examiner

*Primary Examiner*—Thomas R Hannon
*Assistant Examiner*—James Pilkington
(74) *Attorney, Agent, or Firm*—Jackson IPG PLLC

(57) ABSTRACT

A differential gear transmission type work units positioning system includes a linking mechanism, which is formed of a compound gear, a fixed rack, a drive rack, a driven rack, a rail and a screw rod, and is coupled to a number of work units, for example, Charge-Coupled Device work units, pitch-adjustable material suction and feeding work units, or pitch-adjustable material carrying work units for controlling the positioning of the work units and moving the work units at an equal pitch, and a driving mechanism for driving the linking mechanism.

7 Claims, 19 Drawing Sheets

ANNEX 1

311 5 312 313 315 318 307 4 314 309 A 3141 306 1021 308 317 302 203 201 211 3031 3032 303 101 102 301 103 202 104 105

301
302
304
305
308
304
309
305
307
3032
3031
303
4

308
302
301
306
309
3032
303
3031
307
4

303
3031
3032
307
309
301
306
308
302
4

201
103
202
301
305
304
302
306
203
206

DIFFERENTIAL GEAR TRANSMISSION TYPE WORK UNITS POSITIONING SYSTEM

BACKGROUND AND SUMMARY OF THE INVENTION

The present invention relates to a work unit positioning system and more particularly, to a differential gear transmission type multi-pitch adjustable work unit positioning system coupled to a number of work units, for example, Charge-Coupled Device work units, pitch-adjustable material suction and feeding work units, or pitch-adjustable material carrying work units, and adapted to control the positioning of the work units, the pitch among the work units, and the movement of the work units at an equal pitch.

In industrial applications, work units may be used and moved at a predetermined speed ratio. For example, in an automatic optical examination machine for examining printed circuit boards, glass substrates for Liquid Crystal Display, color filters, etc, Charge-Coupled Device work units may be arranged in line at an equal pitch to cover the whole width of the products to be examined. These Charge-Coupled Device work units are connected to respective computers. The examination resolution of the Charge-Coupled Device work units and the computing speed of the computers are fixed and not adjustable. It is not economic to install high-resolution Charge-Coupled Device work units for doing a low-resolution examination work. In this case, the yielding rate will be low. However, when low-resolution Charge-Coupled Device work units are used, they cannot execute a high-resolution examination work.

The present invention has been accomplished under the circumstances in view. The invention eliminates the aforesaid problem by means of arranging the Charge-Coupled Devices of the work units in a pitch adjustable manner to improve the applicability of the equipment to fit different examination requirements. The differential gear transmission type multi-pitch adjustable work unit positioning system comprises a linking mechanism coupled to a number of work units, for example, Charge-Coupled Device work units, pitch-adjustable material suction and feeding work units, or pitch-adjustable material carrying work units, and a driving mechanism for driving the linking mechanism to control the positioning of the work units and to move the work units at an equal pitch.

DETAILED DESCRIPTION OF THE INVENTION

Figure 1:
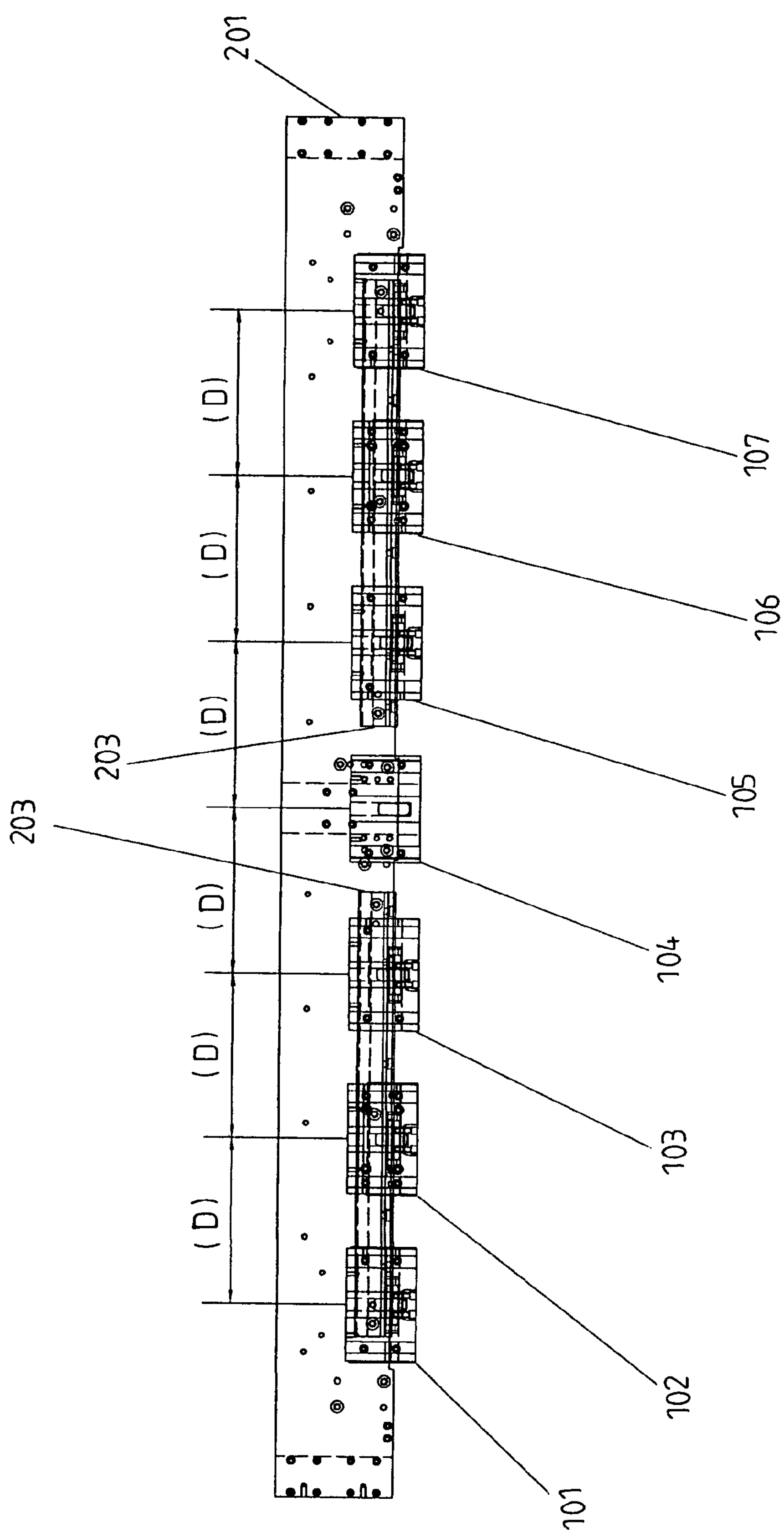
FIG. 1 is a schematic front assembly view of work units, slides, bottom plate, and rails of the preferred embodiment of the present invention.
Figure 2:
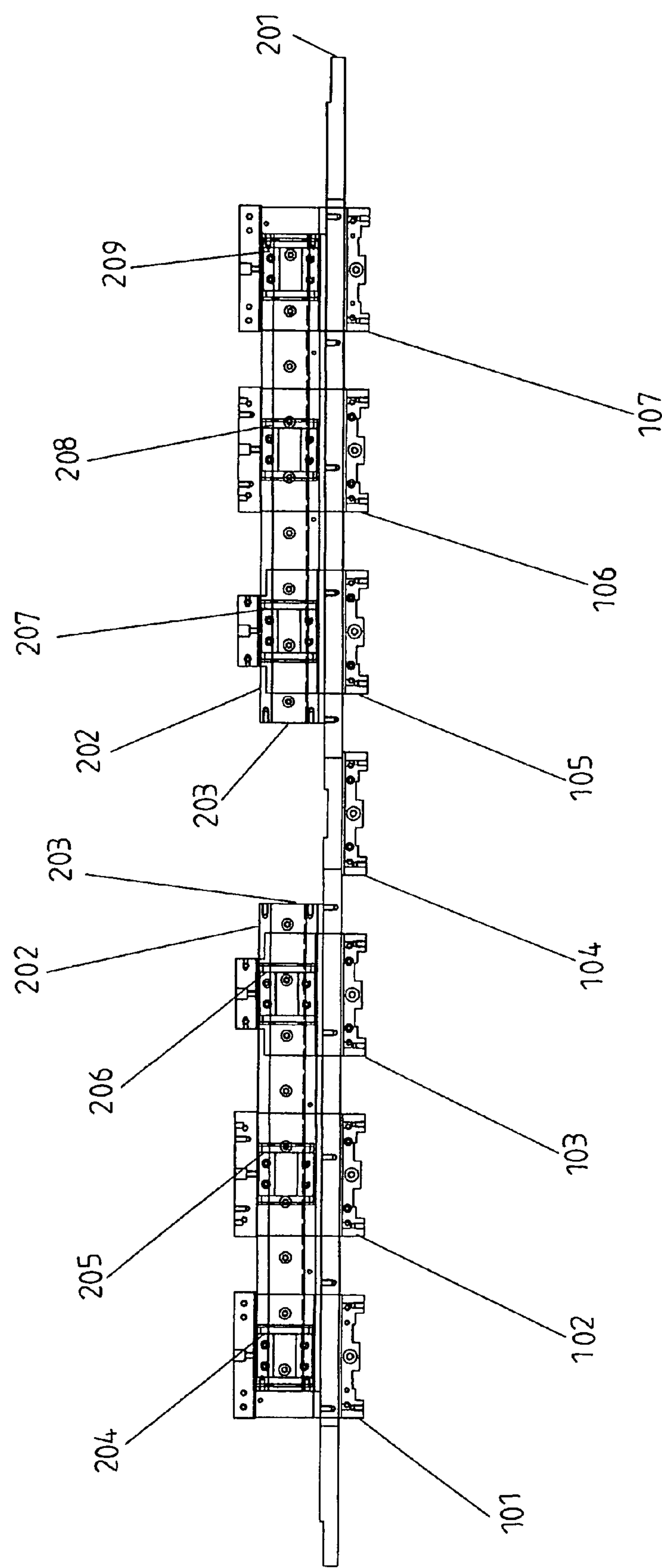
FIG. 2 is a schematic top view of FIG. 1.
Figure 3:
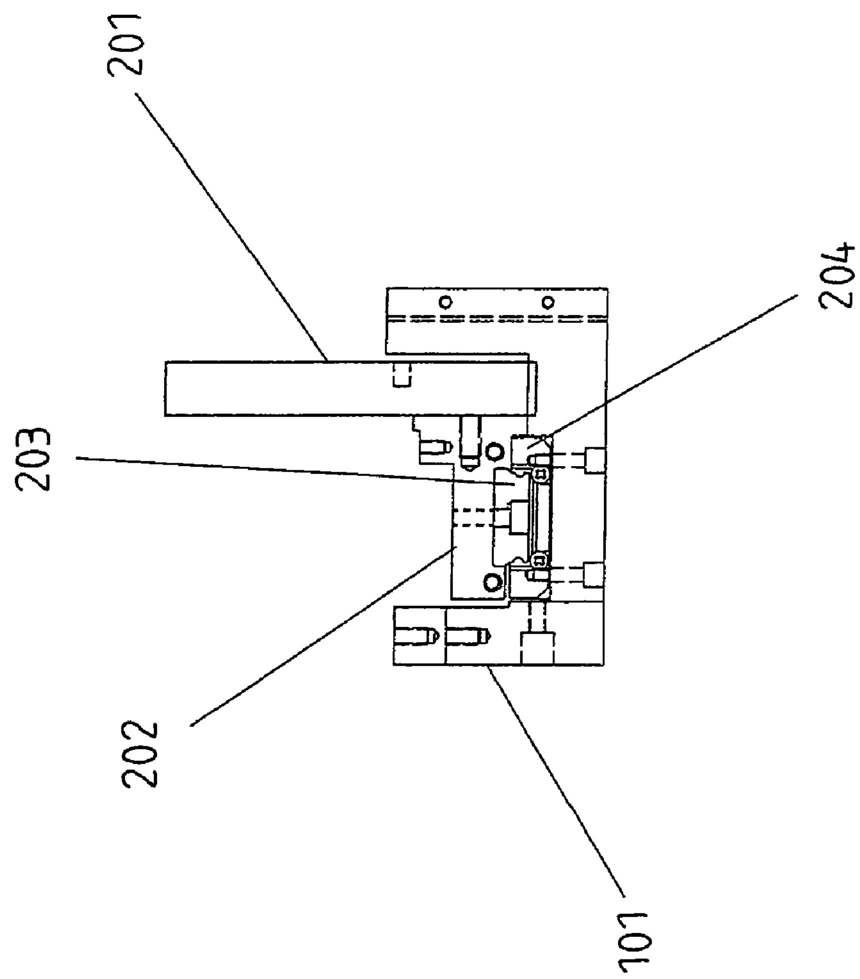
FIG. 3 is a schematic side view of FIG. 1.
Figure 4:
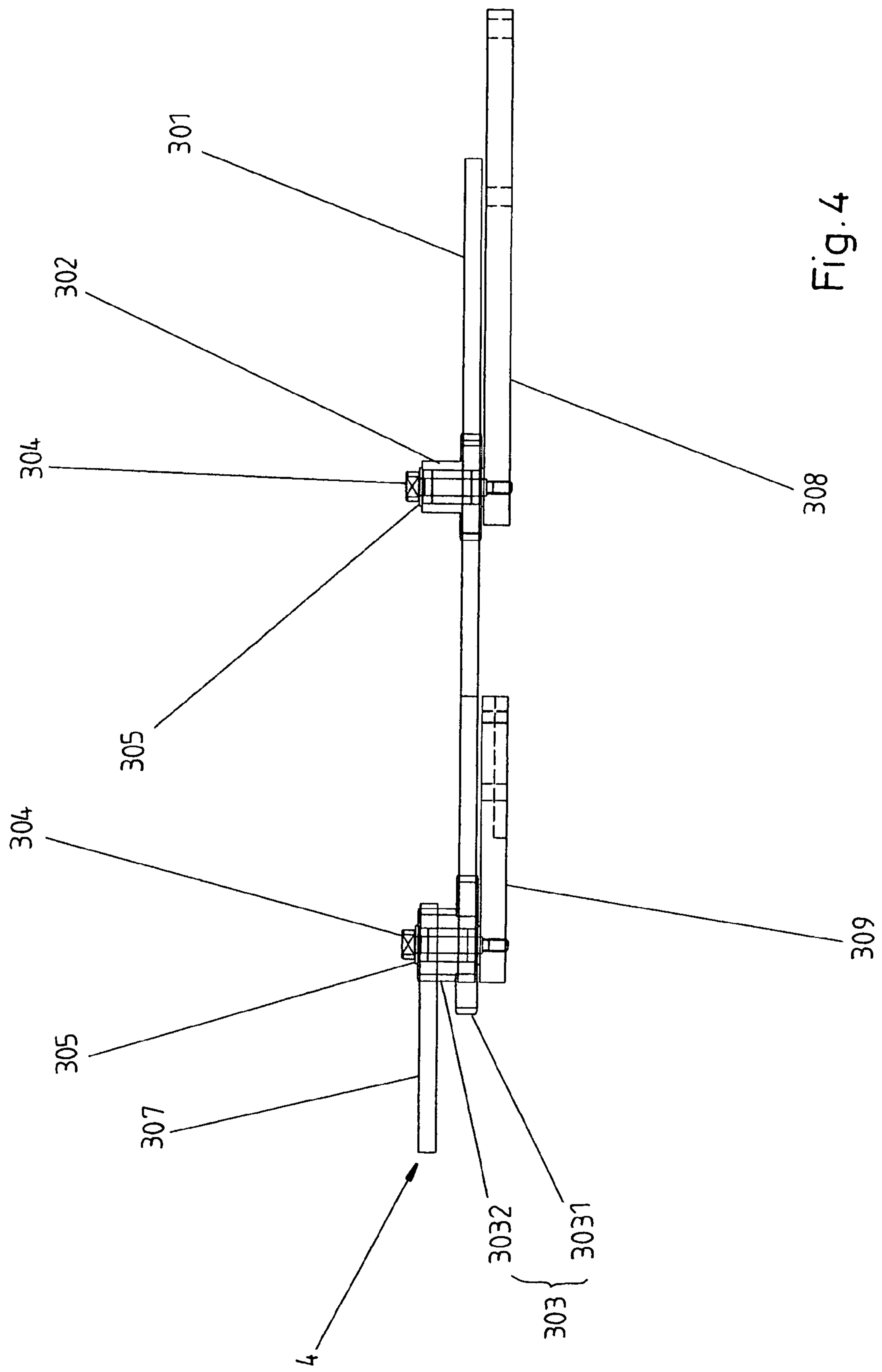
FIG. 4 is a schematic front view of the left-side linking mechanism of the preferred embodiment of the present invention.
Figure 5:
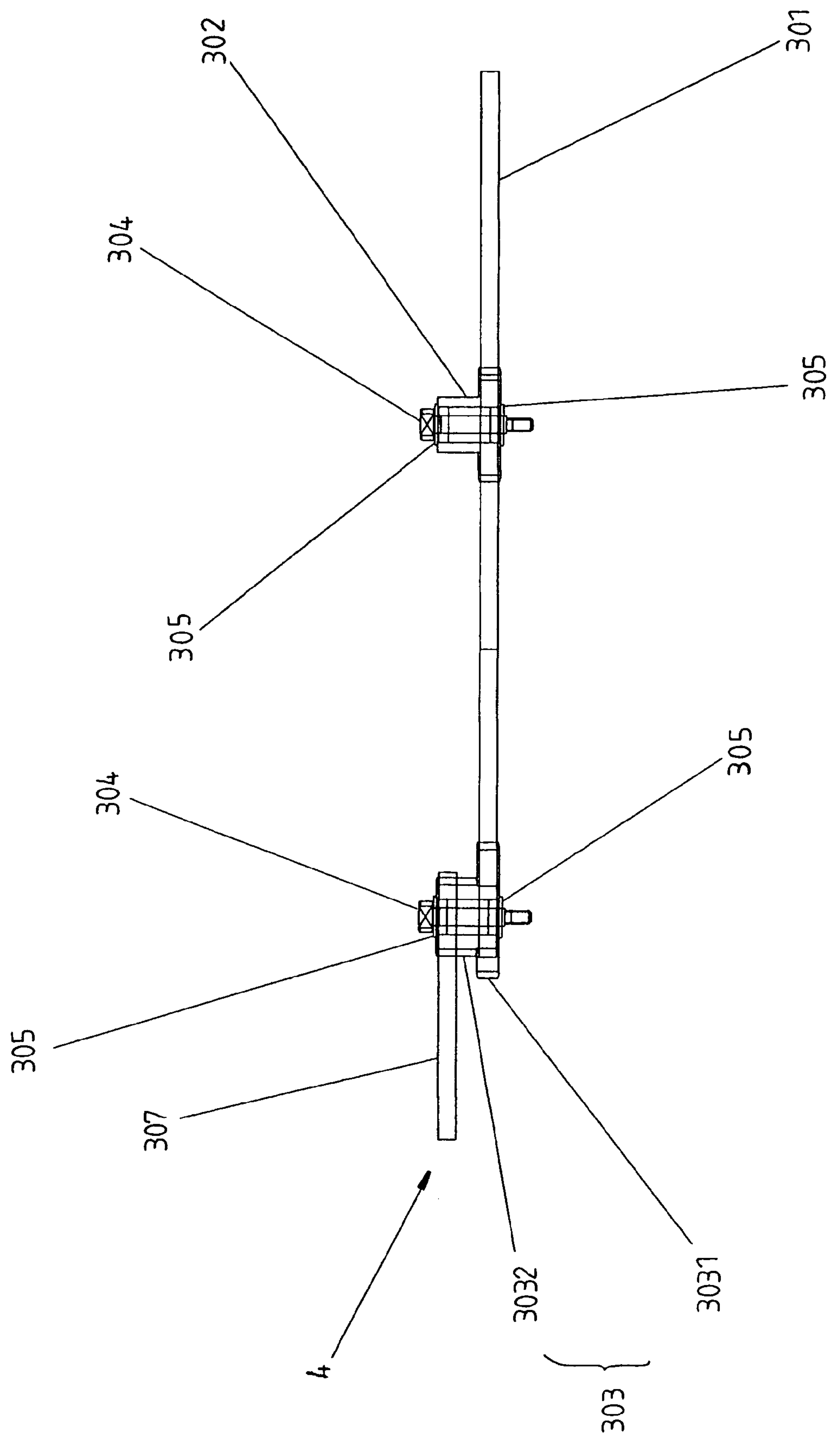
FIG. 5 is a front view in an enlarged scale of FIG. 4.
Figure 6:
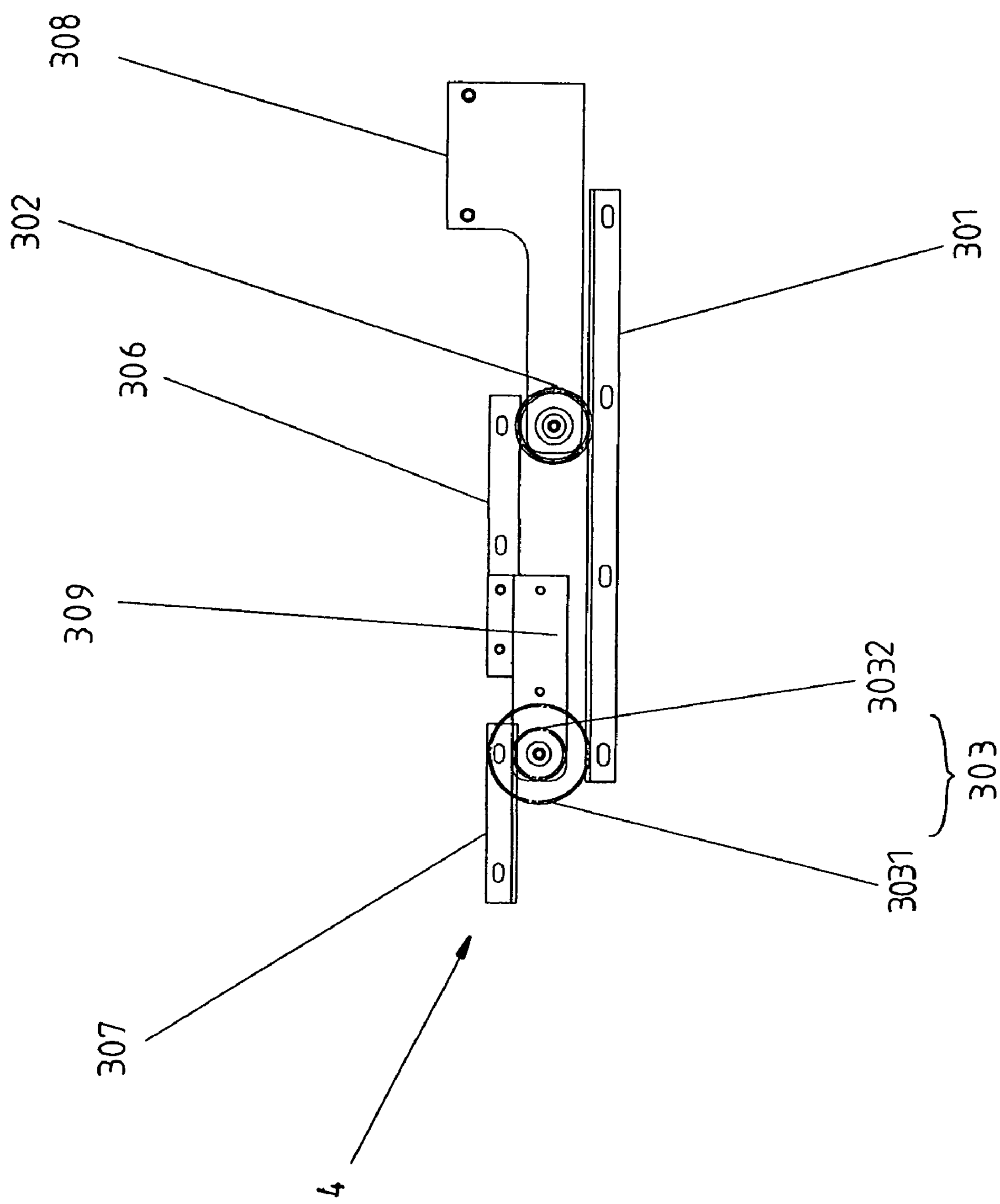
FIG. 6 is a schematic top view of the left-side linking mechanism of the preferred embodiment of the present invention.
Figure 7:
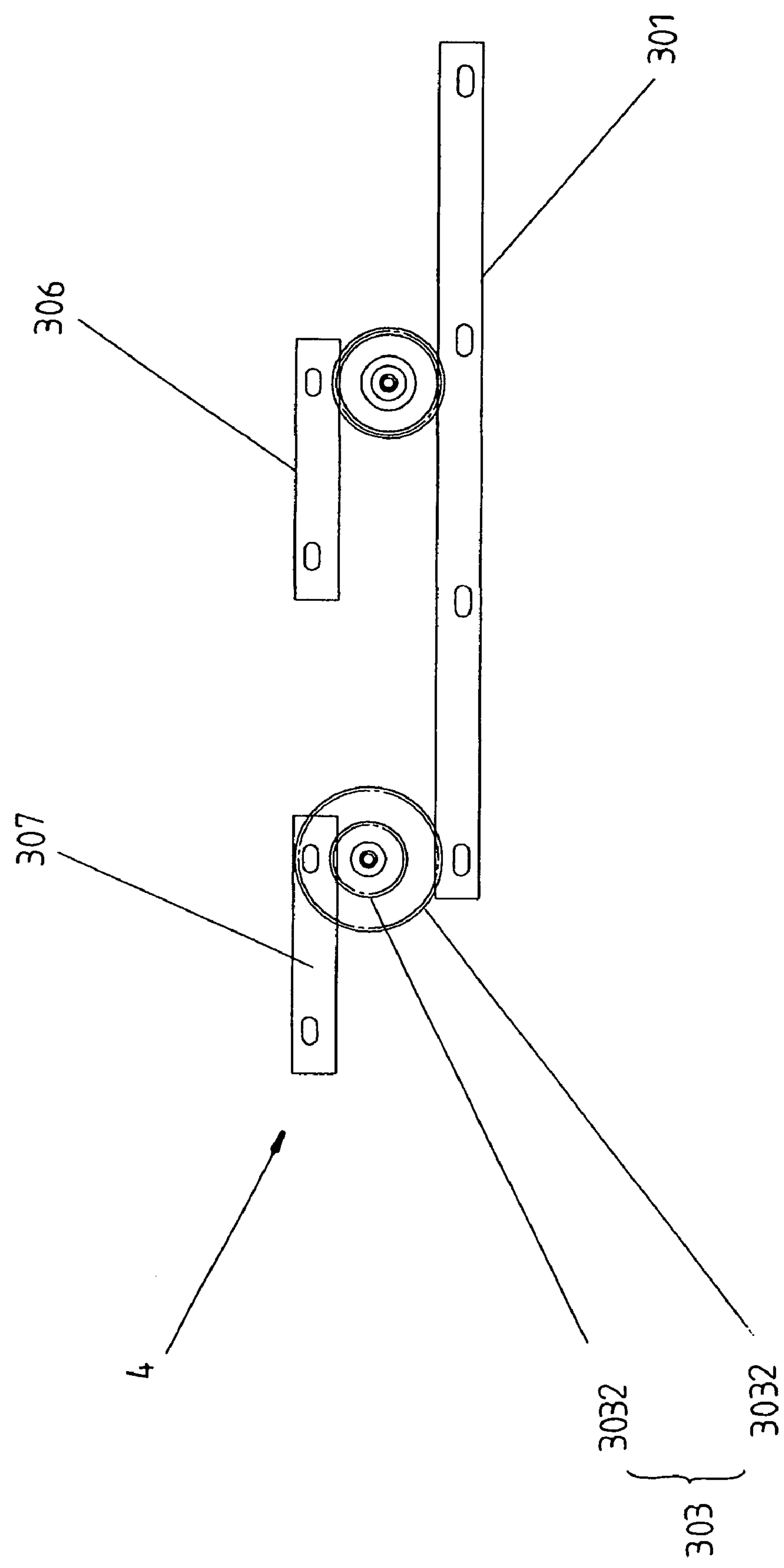
FIG. 7 is an enlarged view of a part of FIG. 6.
Figure 8:
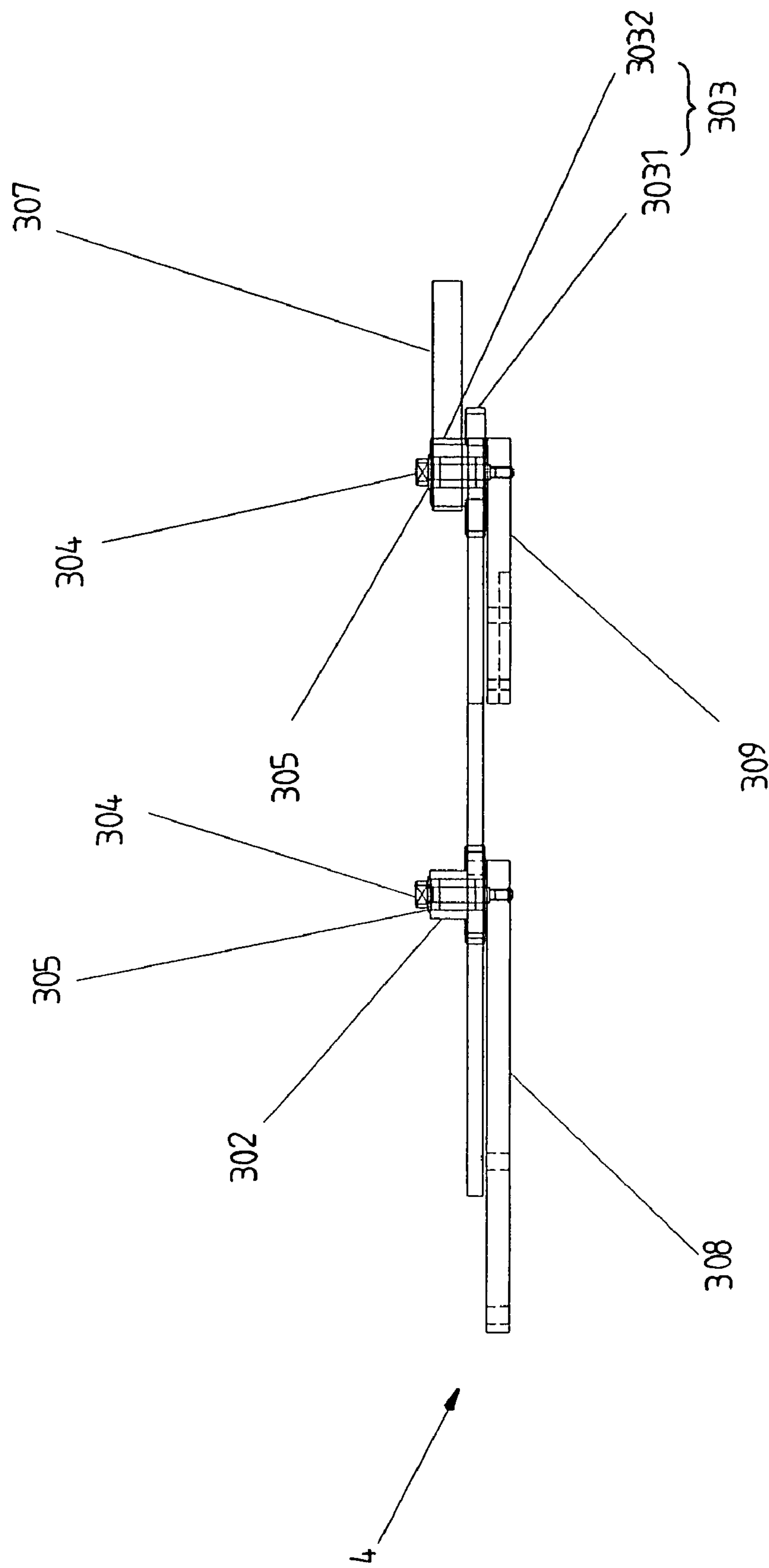
FIG. 8 is a schematic front view of the right-side linking mechanism of the preferred embodiment of the present invention.
Figure 9:
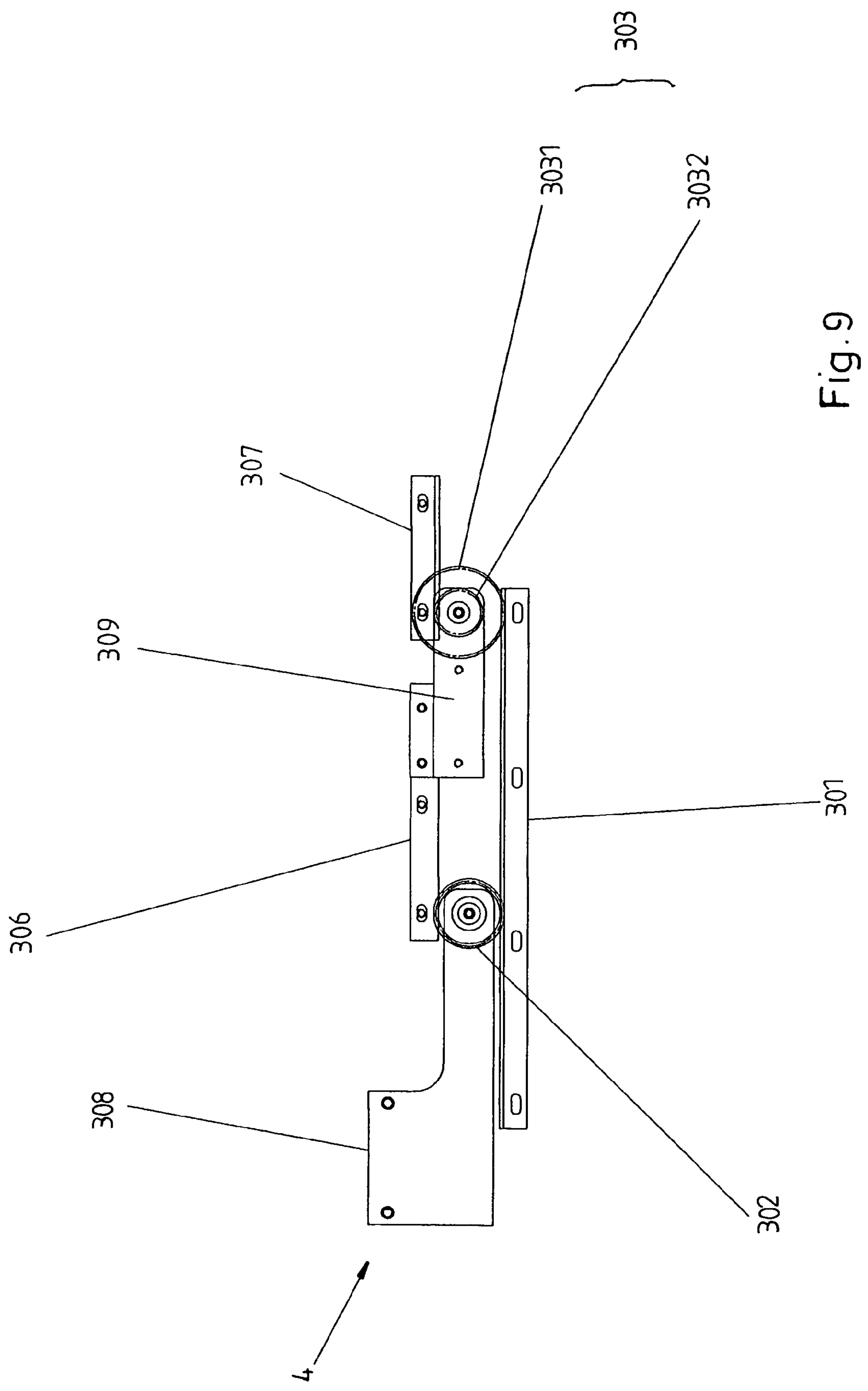
FIG. 9 is a schematic top view of the right-side linking mechanism of the preferred embodiment of the present invention.
Figure 10:
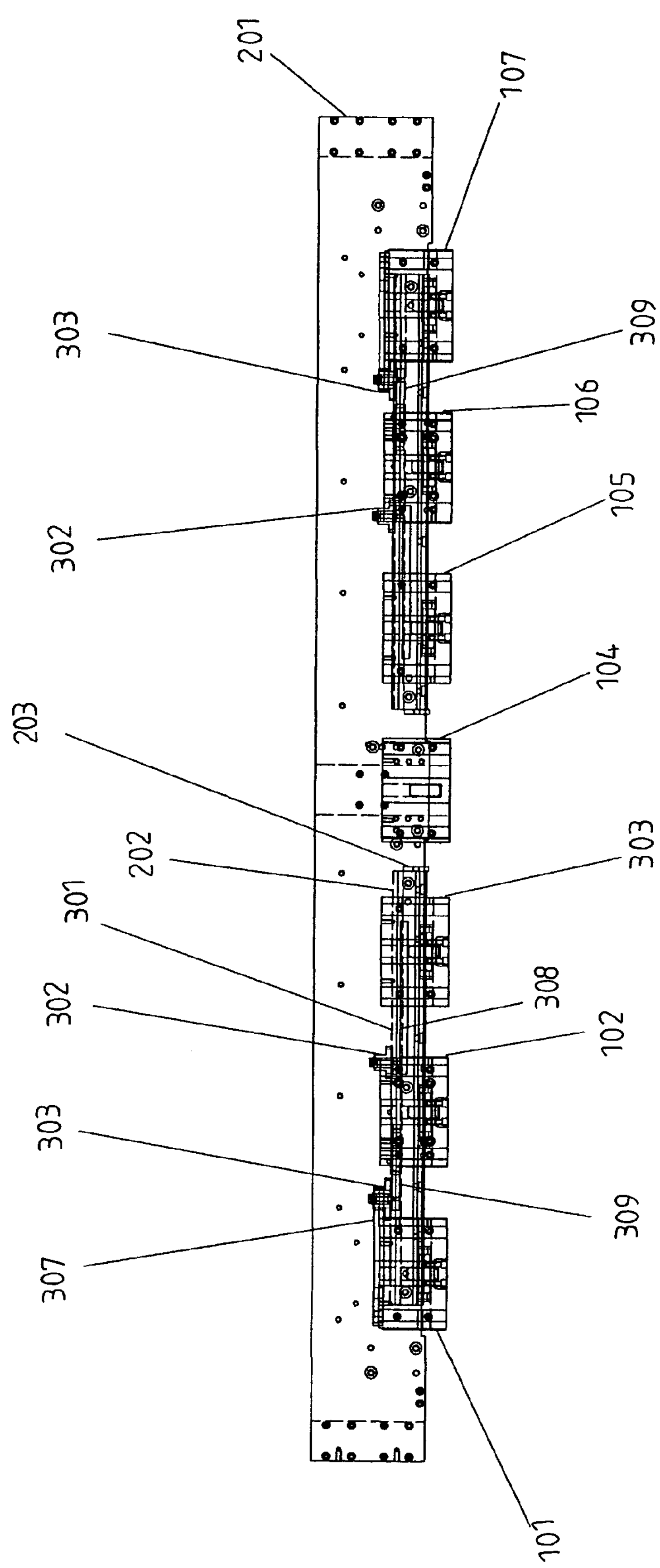
FIG. 10 is a schematic front assembly view of the work units, slides, bottom plate, rails, and linking mechanisms of the preferred embodiment of the present invention.
Figure 11:
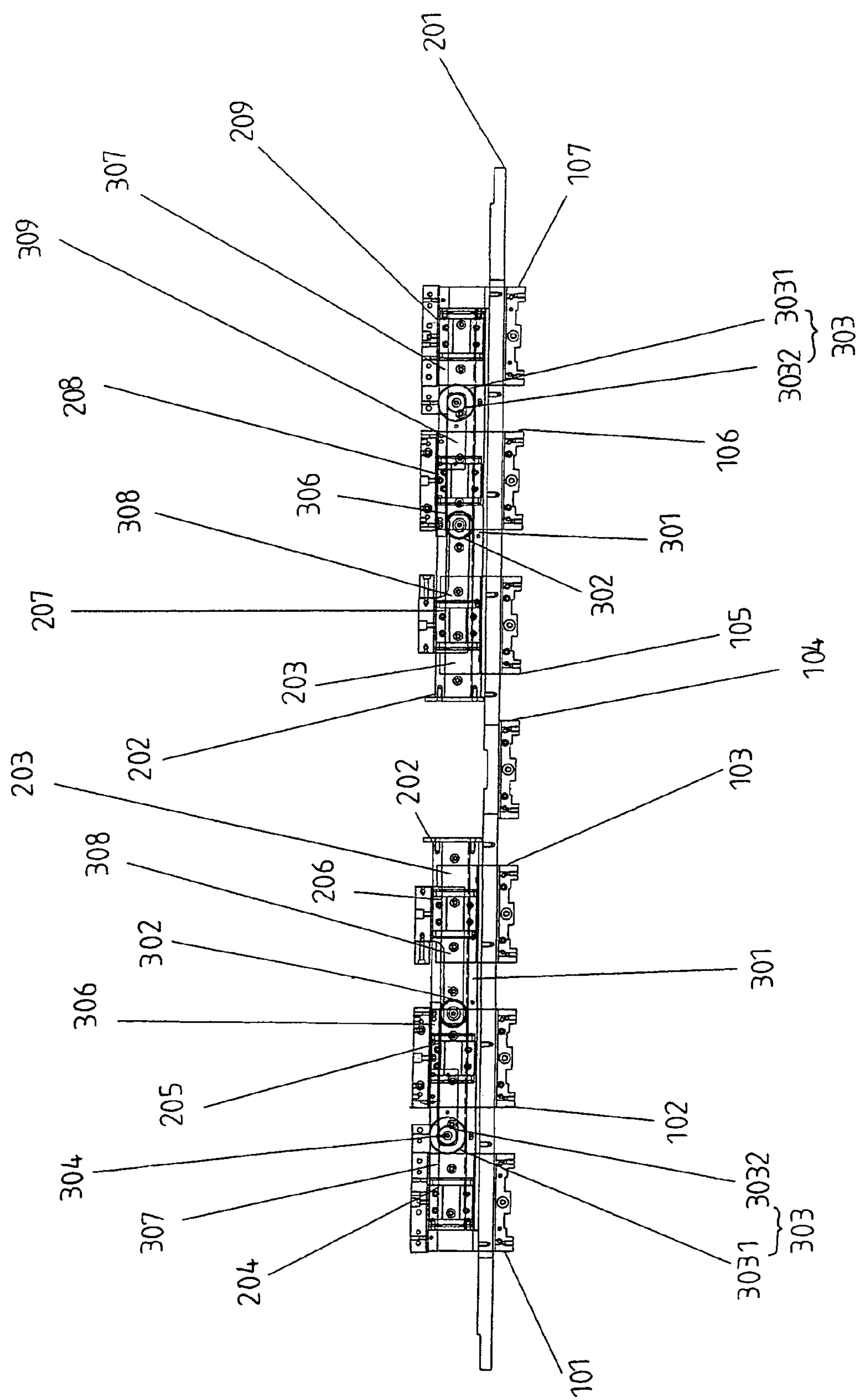
FIG. 11 is a schematic top view of the assembly of FIG. 10.
Figure 12:
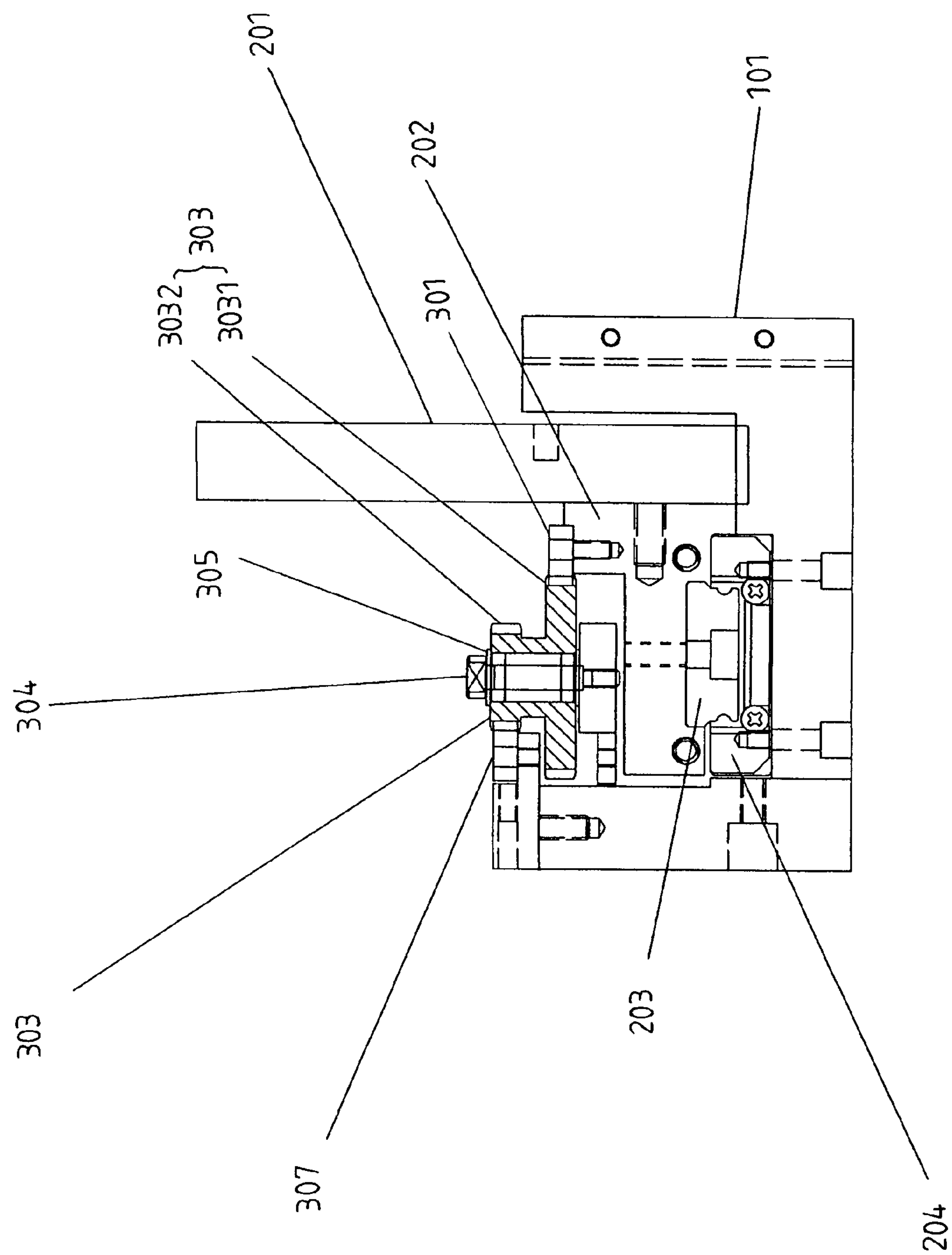
FIG. 12 is a sectional side view in an enlarged scale of the assembly of FIG. 10.

Referring to FIGS. 1~3, a differential gear transmission type multi-pitch adjustable work unit positioning system in accordance with the present invention is adapted to displace a number of work units when keeping the work units at an equal pitch, to adjust the pitch between each two adjacent work units, and to position the work units. According to the present preferred embodiment, there are total seven Charge-Coupled Device work units 101~107 for a big area examination. These Charge-Coupled Device work units 101~107 include a center Charge-Coupled Device work unit 104 fixedly mounted on a bottom plate 201 at the machine base (not shown), three left-side Charge-Coupled Device work units 101~103 arranged at the left side relative to the center Charge-Coupled Device work unit 104, and three right-side Charge-Coupled Device work units 105~107 arranged at the right side relative to the center Charge-Coupled Device work unit 104. Two elongated brackets 202 are fixedly mounted on the bottom plate 201 and aligned in a line at two sides, each holding a rail 203. Slides 204~206 and slides 207~209 are respectively fixedly fastened to the left-side Charge-Coupled Device work units 101~103 and the right-side Charge-Coupled Device work units 105~107 and respectively coupled to the rails 203 at the elongated brackets 202. By means of the operation of two equal-pitch linking mechanisms 4 and a driving mechanism 5 (this will be described further), the left-side Charge-Coupled Device work units 101~103 and the right-side Charge-Coupled Device work units 105~107 can be respectively moved leftwards or rightwards at the speed ratio of 3:2:1 and 1:2:3 toward the center Charge-Coupled Device work unit 104, so that the total seven Charge-Coupled Device work units 101~107 can be moved at an equal pitch D (see FIG. 1) and positioned in the desired position.

Figure 13:
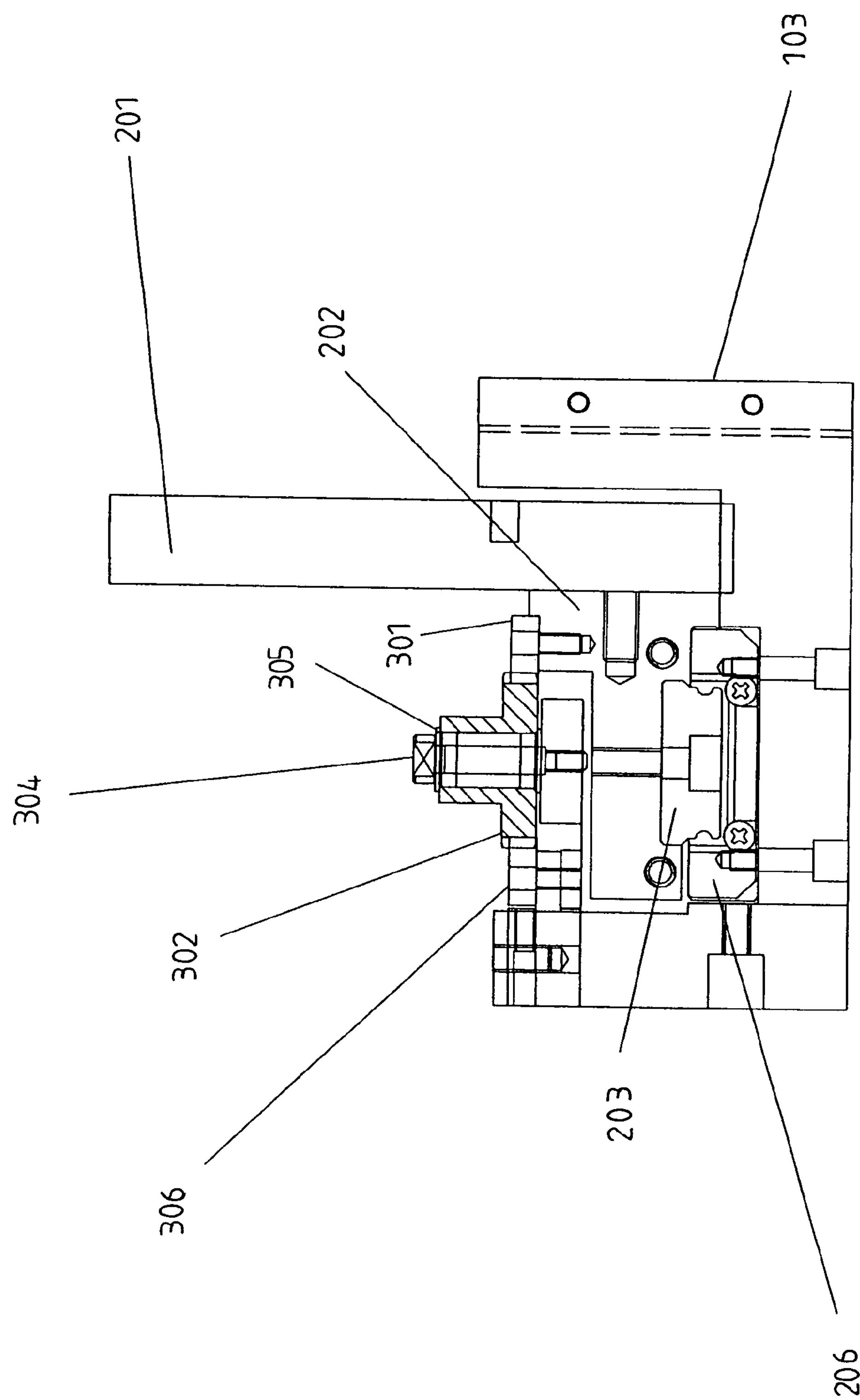
FIG. 13 is another sectional side view in an enlarged scale of the assembly of FIG. 10.
Figure 14:
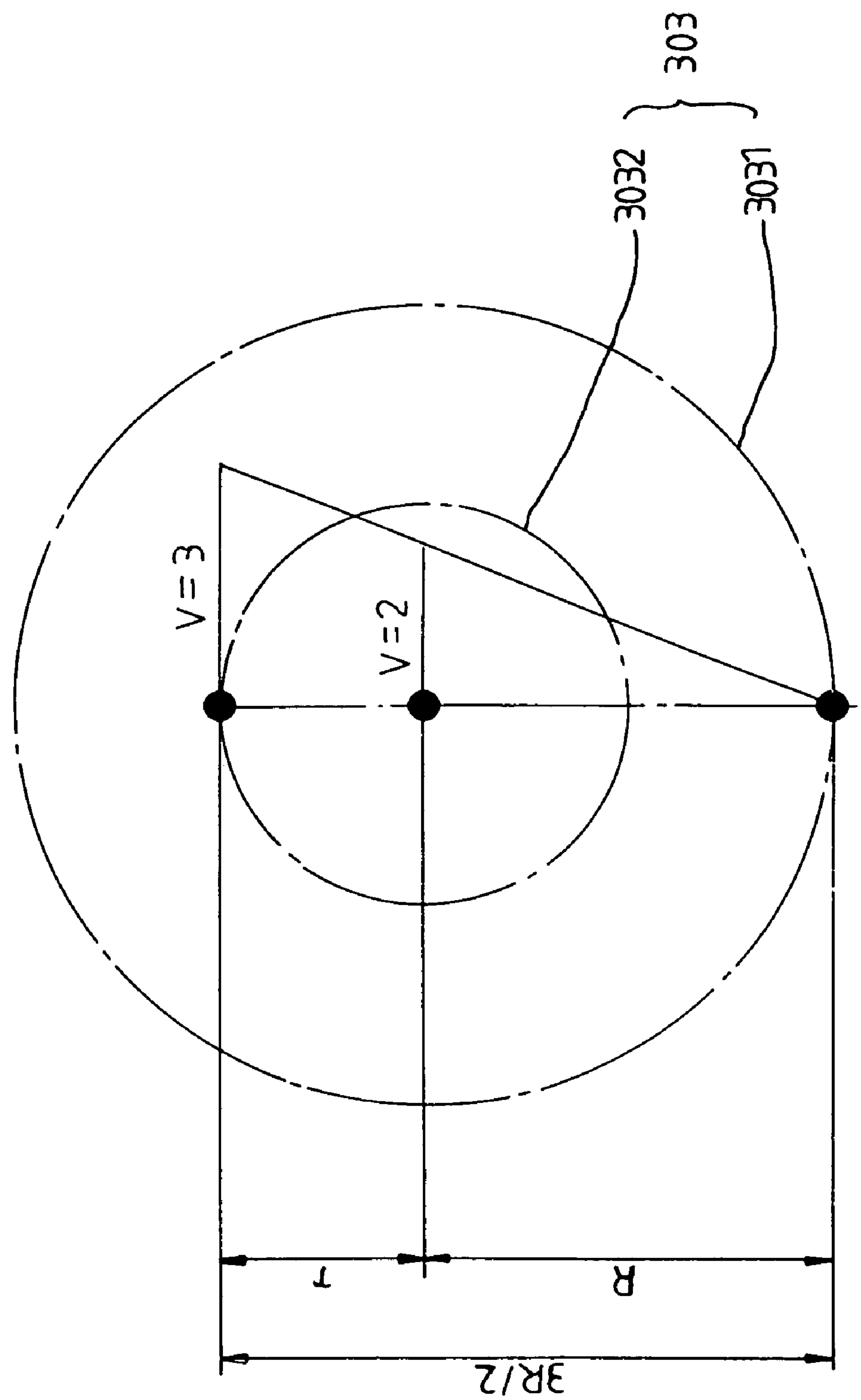
FIG. 14 is an enlarged plain view of the compound gear according to the preferred embodiment of the present invention.
Figure 19:
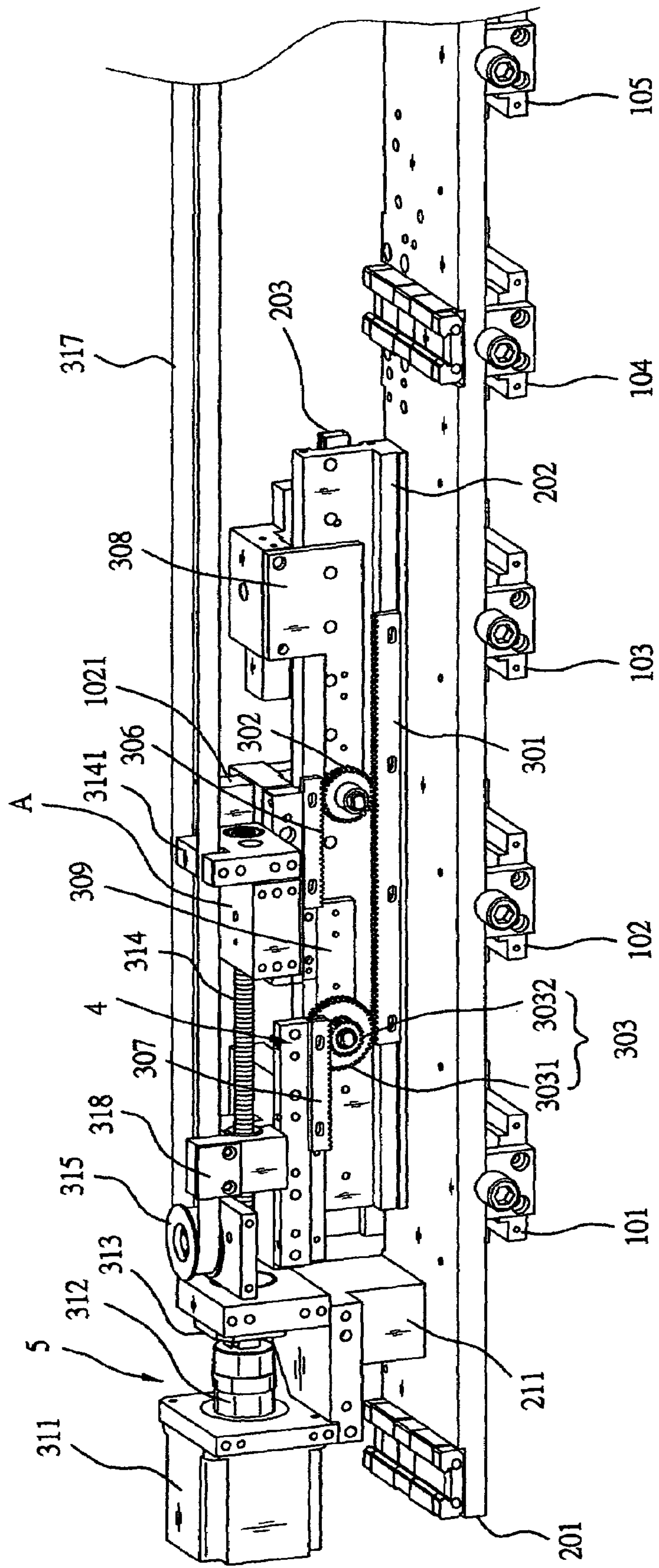
FIG. 19 is a perspective view of the left part of the present invention, showing the arrangement of the driving mechanism and the left-side linking mechanism.

Referring to FIGS. 4~7 and FIGS. 11~13, the left-side equal-pitch linking mechanism 4 for the left-side Charge-Coupled Device work units 101~103 comprises:

a fixed rack 301 fixedly fastened to the left-side bracket 202;

a first coupling block 308 affixed to the (third) Charge-Coupled Device work unit 103 with screws;

a simple gear 302 pivotally mounted in the first coupling block 308 by means of a wheel axle 304 and two bearings 305 (see FIG. 13);

a second coupling block 309 affixed to the (second) Charge-Coupled Device work unit 102 with screws;

a compound gear 303 formed of axially fixedly connected small gar 3032 and big gear 3031 and pivotally mounted in the second coupling block 309 by means of a wheel axle 304 and two bearings 305 (see FIG. 19);

a drive rack 306 fixedly connected to the (second) Charge-Coupled Device work unit 102 and meshed with the simple gear 302 for receiving driving force from the screw rod 314 and step motor 311 of the driving mechanism 5 for movement with the second coupling block 309 and the (second) Charge-Coupled Device work unit 102 for enabling the first coupling block 308 and the (third) Charge-Coupled Device work unit 103 to be moved at one half of the speed and amount of displacement of the second coupling block 309 and the (second) Charge-Coupled Device work unit 102, i.e., to have the displacement speed of the (third) Charge-Coupled Device work unit 103 to be one half of the (second) Charge-Coupled Device work unit 102;

a driven rack 307 fixedly connected to the (first) work unit 101 and meshed with the small gear 3032 of the compound gear 303 (see FIG. 12); and the rail 203 that is mounted on one of the aforesaid brackets 202 at the top in parallel to the fixed rack 301 for guiding movement of the compound gear 303, the drive rack 306 and the driven rack 307 along its extending direction.

Because the speed ratio between the (first) Charge-Coupled Device work unit 101 and the (second) Charge-Coupled Device work unit 102 is 3:2, the speed of displacement V of the center of the compound gear 303 is 2, the speed of displacement V of the driven rack 307 is 3, the relationship of the diameter between the big gear 3031 of the compound gear 303 and the small gear 3032 is $(R+r)/R=3/2\rightarrow 2R+2r=3R\rightarrow R=2r$, i.e. the number of teeth of the big gear 3031 is twice the number of teeth of the small gear 3032. Therefore, when needing a different displacement speed ratio, change the ratio between the big gear 3031 and small gear 3032 of the compound gear 303.

Referring to FIGS. 8 and 9 and FIGS. 11-13, the right-side equal-pitch linking mechanism 4 for the right-side Charge-Coupled Device work units 101-403 comprises:

a fixed rack 301 fixedly fastened to the left-side bracket 202;

a first coupling block 308 affixed to the (fifth) Charge-Coupled Device work unit 105 with screws;

a simple gear 302 pivotally mounted in the first coupling block 308 by means of a wheel axle 304 and two bearings 305;

a second coupling block 309 affixed to the (sixth) Charge-Coupled Device work unit 106 with screws;

a compound gear 303 formed of axially fixedly connected small gar 3032 and big gear 3031 and pivotally mounted in the second coupling block 309 by means of a wheel axle 304 and two bearings 305;

a drive rack 306 fixedly connected to the (sixth) Charge-Coupled Device work unit 106 and meshed with the simple gear 302 for receiving driving force from the screw rod 314 and step motor 311 of the driving mechanism 5 for movement with the second coupling block 309 and the (sixth) Charge-Coupled Device work unit 106 for enabling the first coupling block 308 and the (fifth) Charge-Coupled Device work unit 105 to be moved at one half of the speed and amount of displacement of the second coupling block 309 and the (six) Charge-Coupled Device work unit 106, i.e., to have the displacement speed of the (fifth) Charge-Coupled Device work unit 105 to be one half of the (sixth) Charge-Coupled Device work unit 106;

a driven rack 307 fixedly connected to the (seventh) work unit 107 and meshed with the small gear 3032 of the compound gear 303 (see FIG. 12); and the rail 203 that is mounted on the other of the aforesaid brackets 202 at the top in parallel to the fixed rack 301 for guiding movement of the compound gear 303, the drive rack 306 and the driven rack 307 along its extending direction.

Figure 15:
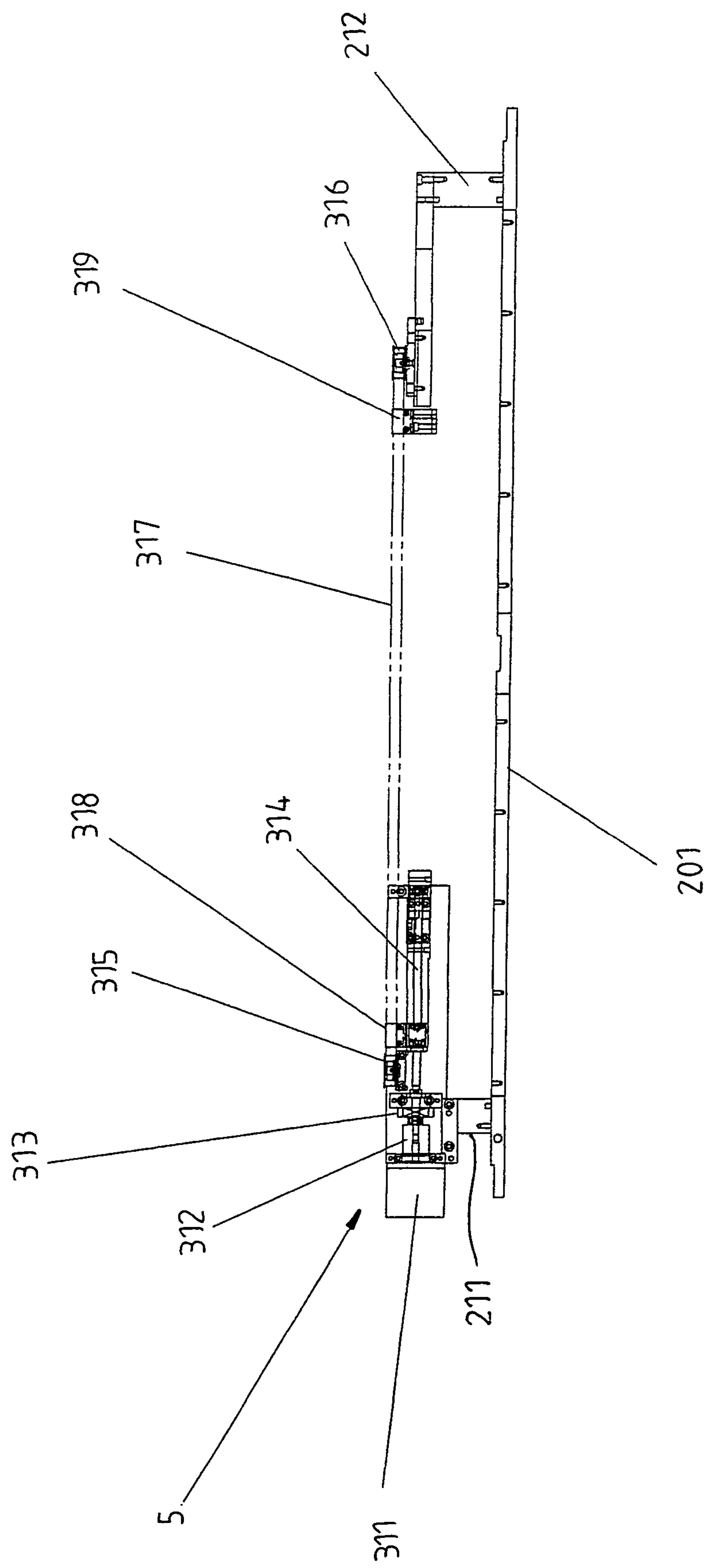
FIG. 15 is a schematic top assembly view of the driving mechanism in the bottom plate according to the preferred embodiment of the present invention.
Figure 16:
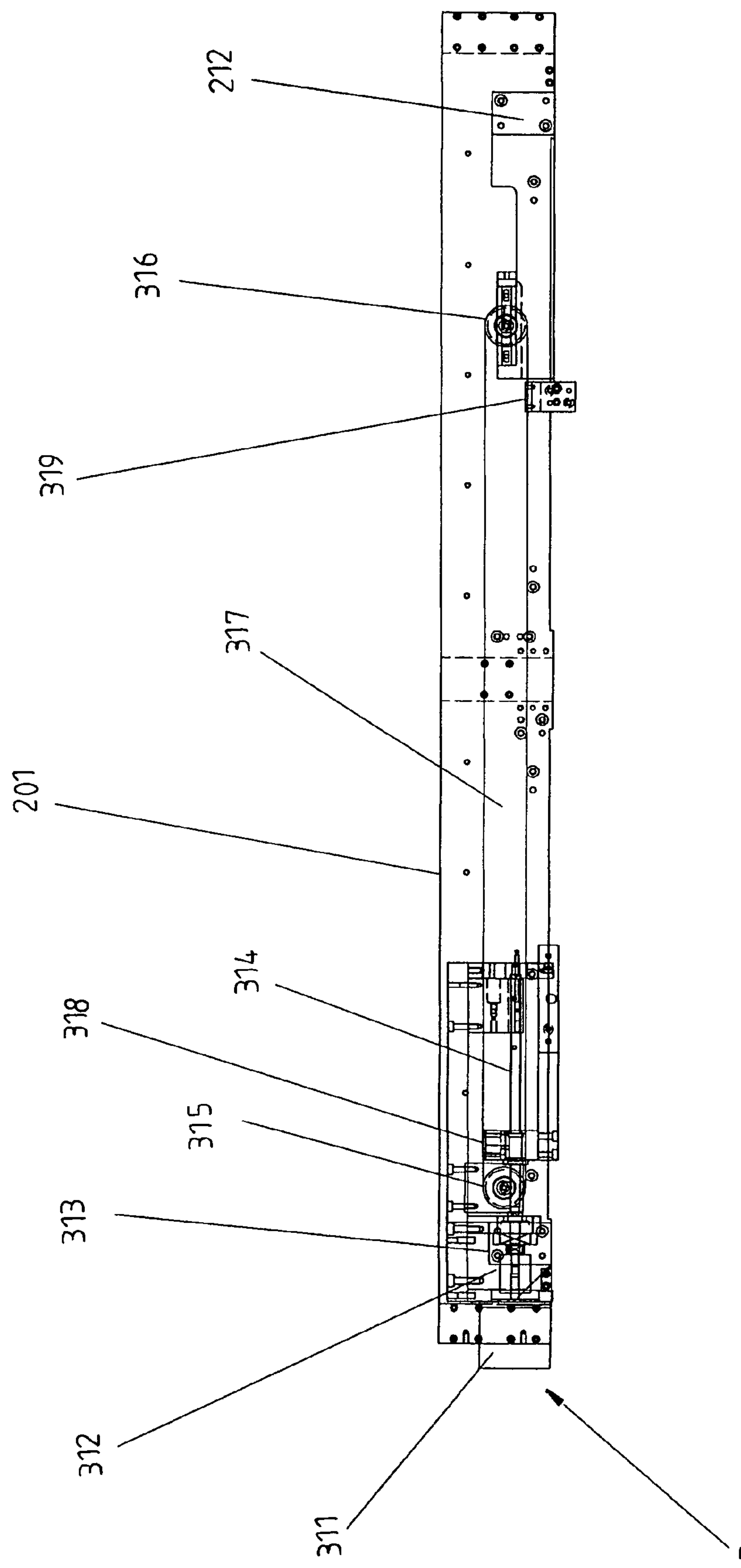
FIG. 16 is a schematic front view of the assembly shown in FIG. 15.

Referring to FIGS. 15 and 16, the driving mechanism 5 comprises a step motor 311, a coupling 312, a bearing block 313, a screw rod 314, a fixed idle wheel set 315, an adjusting idle wheel set 316, a resilient endless steel belt 317, a left-side steel belt clamp 318, and a right-side steel belt clamp 319. Further, the bottom plate 201 is provided with a mount 211 at one lateral side and a support 212 at the other lateral side. The step motor 311 is installed in the mount 211 at a suitable location. By means of the step motor 311, the coupling 312, the bearing block 313 and the screw rod 314, the driving mechanism 5 provides driving force for accurate positioning of the present invention. The ball nut of the screw rod 314 is installed in the left-side steel belt clamp 318, for enabling the left-side steel belt clamp 318 to move the endless steel belt 317. The endless steel belt 317 is mounted on the fixed idle wheel set 315 and the adjusting idle wheel set 316. By means of the driving of the screw rod 314, the left-side steel belt clamp 318 and the right-side steel belt clamp 319 can symmetrically be reciprocated at the left and right sides, and therefore the left-side Charge-Coupled Device work units 101-103 and the right-side Charge-Coupled Device work units 105-107 can respectively be moved leftwards or rightwards at the speed ratio of 3:2:1 and 1:2:3 toward the center Charge-Coupled Device work unit 104 and then positioned.

Figure 17:
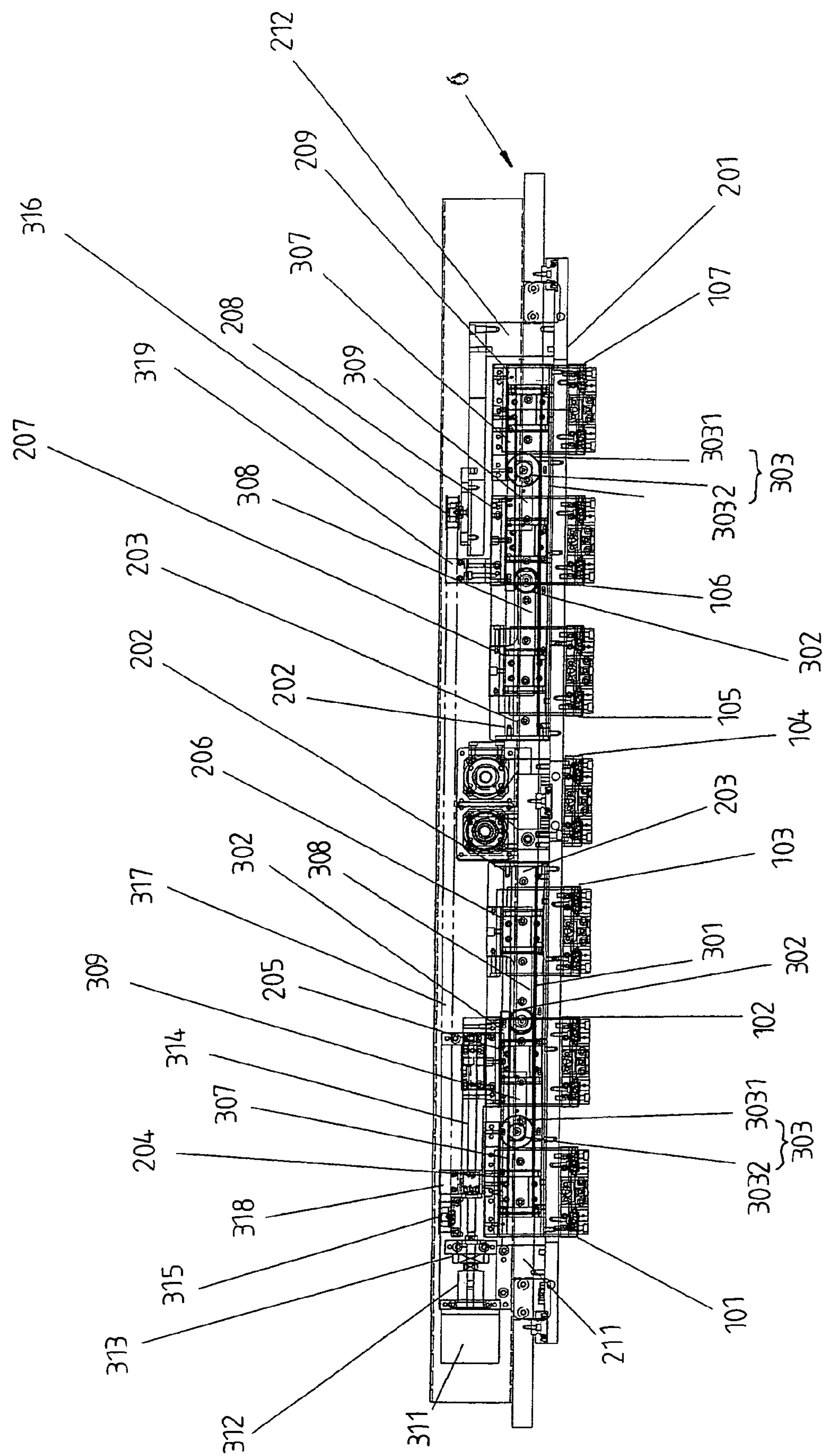
FIG. 17 is a schematic top view showing the invention installed in the machine base of an optical examination machine.
Figure 18:
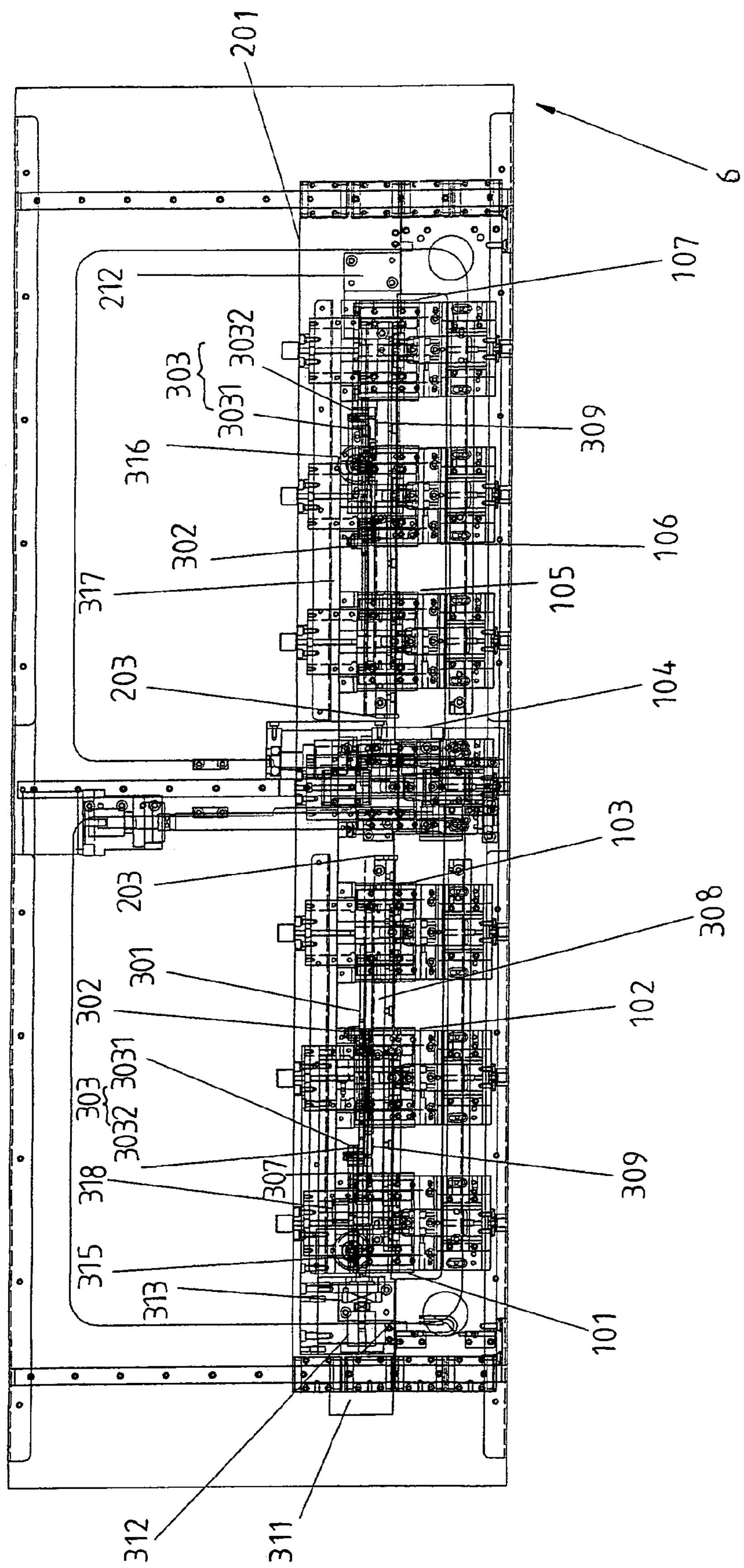
FIG. 18 is a front view of FIG. 17.

FIGS. 17 and 18 show an application example of the present invention. As illustrated, the invention is installed in the machine base 6 of an automatic optical examination machine. The other devices installed in the machine base 6 are not within the scope of the claims of the present invention, and therefore no further detailed description in this regard is necessary.

As indicated above, the main point of the design of the present invention is that the number of teeth of the big gear 3031 of the compound gear 303 of each of the left-side and right-side equal equal-pitch linking mechanisms 4 and the number of teeth of the small gear 3032 thereof determine the speed ratio between the compound gear 303 and the meshed drive rack 306 or driven rack 307. Further, the center (fourth) Charge-Coupled Device work unit 104 of the seven Charge-Coupled Device work units 101~107 is immovable, the left-side Charge-Coupled Device work units 101~103 and the right-side Charge-Coupled Device work units 105~107 are movable leftwards or rightwards toward the fixed center (fourth) Charge-Coupled Device work unit 104 at the speed ratio of 3:2:1 and 1:2:3. Therefore, the seven Charge-Coupled Device work units 101~107 can be moved and positioned at an equal pitch. This design is practical and has industrial value.

While only one embodiment of the present invention has been shown and described, it will be understood that various modifications and changes could be made thereunto without departing from the spirit and scope of the invention. For example, the work units can be of any of a variety of types for different applications, keeping the work units movable at an equal pitch; the work units can also be pitch-adjustable material suction and feeding work units, pitch-adjustable material carrying work units, or the like; the work units that are connected to the drive rack may be changed to fit different needs; the compound gear can be formed of two gears having the same number of teeth. Accordingly, the invention is not limited except as by the appended claims.

What is claimed is:

1. A differential gear transmission type work units positioning system comprising:

a linking mechanism coupled to a number of work units for controlling the positioning of said work units and moving said work units at an equal pitch, and only a single driving mechanism for driving said linking mechanism to control both the pitch among the work units and the movement of the work units at the equal pitch, said linking mechanism comprising:

a first coupling block affixed to one of said work units with screws;

a simple gear pivotally mounted in said first coupling block by means of a wheel axle and two bearings;

a second coupling block affixed to another of said work units with screws;

a compound gear formed of a top gear and a bottom gear, said top gear and said bottom gear being axially fixedly connected together and pivotally mounted in said second coupling block by means of a wheel axle and two bearings;

a drive rack fixedly connected to the work unit where said second coupling block is installed and meshed with said simple gear;

a driven rack fixedly connected to another of said work units and meshed with the top gear of said compound gear;

a fixed rack mounted on a bracket; and a rail arranged in parallel to said fixed rack for guiding linear movement of said compound gear, said drive rack and said driven along the extending direction of said rail.

2. The differential gear transmission type work units positioning system as claimed in claim 1, wherein said rail is fixedly mounted on said bracket, which is fastened to a bottom plate of a machine base.

3. The differential gear transmission type work units positioning system as claimed in claim 1, wherein said driving mechanism comprises a step motor, a coupling, a bearing block, a ball screw rod, a fixed idle wheel set, an adjusting idle wheel set, a endless steel belt, a left-side steel belt clamp, and a right-side steel belt clamp, said step motor being installed in a mount at one lateral side of said bottom plate, said screw rod being installed in said left-side steel belt clamp for moving said endless steel belt, said endless steel belt being mounted on said fixed idle wheel set and said adjusting idle wheel set, said screw rod being rotatable by said step motor to turn said endless steel belt on said fixed idle wheel set and said adjusting idle wheel set alternatively forwards and backwards and to further reciprocate said left-side steel belt clamp and said right-side steel belt clamp at left and right sides.

4. The differential gear transmission type work units positioning system as claimed in claim 1, wherein said work units are pitch-adjustable repeated work units.

5. The differential gear transmission type work units positioning system as claimed in claim 1, wherein said work units are Charge-Coupled Device work units for big area examination.

6. The differential gear transmission type work units positioning system as claimed in claim 1, wherein said work units are pitch-adjustable material suction and feeding work units.

7. The differential gear transmission type work units positioning system as claimed in claim 1, wherein said work units are pitch-adjustable material carrying work units.

* * * * *